United States Patent [19]

Bates

[11] Patent Number: 5,754,391

[45] Date of Patent: May 19, 1998

[54] ELECTROSTATIC CHUCK

[75] Inventor: Herbert E. Bates, Milford, N.H.

[73] Assignee: Saphikon Inc., Milford, N.H.

[21] Appl. No.: 649,780

[22] Filed: May 17, 1996

[51] Int. Cl.$^6$ .................................................. H02N 13/00
[52] U.S. Cl. .................................................. 361/234
[58] Field of Search ........................... 361/230, 233, 361/234, 235; 269/8, 903; 279/128

[56] References Cited

U.S. PATENT DOCUMENTS

| | | | |
|---|---|---|---|
| 3,591,348 | 7/1971 | La Belle, Jr. | 23/301 |
| 3,687,633 | 8/1972 | La Belle, Jr. et al. | 23/273 SP |
| 3,953,174 | 4/1976 | La Belle, Jr. | 23/273 SP |
| 5,103,367 | 4/1992 | Horwitz et al. | 361/234 |
| 5,271,274 | 12/1993 | Khuri-Yakub et al. | 73/597 |
| 5,413,360 | 5/1995 | Atari et al. | 279/128 |
| 5,426,558 | 6/1995 | Sherman | 361/234 |
| 5,436,790 | 7/1995 | Blake et al. | 361/234 |
| 5,445,709 | 8/1995 | Kojima et al. | 216/71 |
| 5,452,177 | 9/1995 | Frutiger | 361/234 |
| 5,452,510 | 9/1995 | Barnes et al. | 29/825 |
| 5,535,090 | 7/1996 | Sherman | 361/234 |
| 5,600,530 | 2/1997 | Smith | 361/234 |

OTHER PUBLICATIONS

*Semiconductor International* "Electrostatic Chucks in Wafer Processing", (a Cahners Publication, Peter Singer, Senior Editor) Apr. 1995.

*Primary Examiner*—Fritz Fleming
*Attorney, Agent, or Firm*—Lahive & Cockfield, LLP

[57] ABSTRACT

An electrostatic wafer-holding chuck includes first and second dielectric plates formed of single crystal aluminum oxide and at least one electrode disposed within a recess formed in the first dielectric plate. The second dielectric plate has a top wafer-supporting surface that has a fluid distribution network formed therein. The fluid distribution network channels a heat transfer medium to the backside of the wafer. When the first and second dielectric plates are assembled, the first dielectric plate is disposed contiguous to the second dielectric plate and then are diffusively joined together to form a monolithic, hermetically-sealed electrostatic chuck.

17 Claims, 1 Drawing Sheet

ELECTROSTATIC CHUCK

BACKGROUND OF THE INVENTION

The present invention relates to methods and apparatus for securing a semiconductor substrate to a chuck, and more particularly to methods and apparatus for electrostatically clamping a semiconductor substrate to a chuck.

In the fabrication of integrated circuits, a number of well-established processes are used to treat and process a semiconductor wafer. Apparatus for clamping the wafer can be used with any conventional processing technique. These processes include, for example, chemical vapor deposition, ion implantation, ion beam milling and reactive ion etching. One example is conventional ion implantation systems which include an ion source that ionizes a desired dopant, which is then accelerated to form an ion beam of prescribed energy. The ion beam is then directed at the top surface of a target wafer. The energetic ions in the beam penetrate into the bulk of the semiconductor material and are embedded in the crystalline lattice of the semiconductor material to form a region of desired conductivity. This ion implantation process is typically performed in a high vacuum, gas-tight process chamber which encases a wafer handling assembly.

An important feature of conventional ion implantation systems is the securing or clamping of the semiconductor wafer to the wafer handling assembly. This clamping feature properly positions the wafer at a selected location while facilitating cooling of the wafer by rigidly and tightly clamping the wafer to the relatively cool platen surface of the wafer handling assembly. Wafer cooling is particularly important in commercial semiconductor processing where a major objective is to achieve a high throughput implantation system in terms of wafers processed per unit time. One way to achieve such a high throughput system is to use a relatively high current ion beam which implants wafers in a relatively short period of time. The use of high current implanters, however, generate large amounts of heat which can result in uncontrolled diffusion of impurities beyond prescribed limits in the wafer and in degradation of patterned photoresist layers. It is thus usually necessary to provide structure that cooperates with the clamping mechanism to cool the wafer in order to limit the maximum wafer temperature. A variety of techniques for clamping and cooling the wafer to the wafer handling assembly have been developed and are known in the art.

According to one well-known technique, the wafer is clamped against the platen surface of the wafer handling assembly by a peripheral clamping ring which engages the outer peripheral portion of the wafer. The front surface of the wafer is then exposed for ion implantation. A drawback of this type of clamping assembly is that the ring covers a portion of the outer periphery of the wafer, thus preventing that portion from being implanted by the ion source. Another drawback is that peripheral clamping does not result in physical contact between the wafer and the flat metal platen over the entire wafer surface area. This occurs since the clamping force is applied to just the peripheral edge and not uniformly across the entire wafer surface, and thus does not pull the wafer flat against the platen surface. One advantage of uniform clamping of the wafer to the platen is that it provides for more efficient cooling of the wafer. In many of these conventional configurations, however, thermal transfer is inadequate due to poor contact between the semiconductor wafer and the platen surface.

Another drawback of conventional peripheral clamps is that obscuring a portion of the usable wafer area reduces the overall wafer yield, thus increasing waste and production costs. Still another drawback is that the peripheral ring clamp creates unwanted wafer stress that may create microcracks within the wafer. The presence of microcracks within the wafer may affect the operating performance of the integrated circuits formed on the wafer, thus rendering unusable portions of the wafer or indeed the entire wafer itself.

A wafer clamping technique which eliminates the requirement for a peripheral clamping ring and which permits use of a flat platen surface is centrifugal clamping. In centrifugal clamping, the semiconductor wafer is rotated about an axis of rotation by known rotation machinery. The platen surface is typically oriented at an angle with respect to the axis of rotation so that centrifugal force presses the wafer against the platen surface. A drawback of this system is that the rotation machinery is relatively complex and expensive, and thus adds to the overall cost of the system.

Another known technique for clamping semiconductor wafers involves the use of electrostatic chucks (ESCs). Although ESCs vary in design, they all are based upon the same physical principles, namely, the creation of an electrostatic force between the platen surface and the semiconductor wafer. Typical ESCs include an electrically conductive electrode that is mounted on a pedestal and covered by an electrically insulative, dielectric material. The semiconductor wafer seats on top of the insulative material. A voltage source electrically biases the electrode so that electric charge accumulates in the electrode and the insulative material. The applied voltage then induces an equal and opposite charge on the rear surface of the wafer. This accumulated electric charge generates an electrostatic force that attracts and clamps the wafer against the insulative material. The amount of clamping charge, which determines the clamping force, is dependent, among others, on the thickness of the dielectric material and the material's dielectric constant.

An advantage of conventional ESCs is their ability to pull the wafer substantially flat against the platen surface of the wafer handling assembly by applying the clamping voltage/force across the entire wafer surface, and not just at the edges. This allows for more effective and efficient cooling of the wafer, while concomitantly avoiding the microcracks that can develop when using conventional mechanical clamps, such as ring clamps, and cooling structure.

Another advantage of ESCs is that they do not employ structure that engages the top surface of the wafer. This increases the overall wafer yield since the entire wafer surface is available for processing.

The insulative layer is typically composed of polyimides and other organic polymers because of their resistance to high voltage breakdown and their superior chemical resistance. Further, the ability of the polyimide to conform to the backside of the substrate allows for good heat transfer for wafer cooling during processing. A drawback of polyimides and other organic polymers is that they react rapidly when exposed to corrosive gases such as phosphene, oxygen, chlorine and fluorine, which are typically used in the processing of semiconductor wafers.

A significant problem with conventional ESCs is that the dielectric material becomes polarized over time, and tends to act as a permanent magnet, clamping the wafer to the platen surface until long after the scheduled release time. These residual electrostatic forces may arise from permanent polarization of the dielectric material, from slow mobile ions located within the dielectric, or more commonly from charges trapped at the dielectric surface or wafer backside when the wafer has an insulating layer. This unwanted and prolonged clamping of the wafer to the platen surface increases the wafer processing time, while concomitantly introducing an element of unreliability into the wafer manufacturing process.

Due to the foregoing and other shortcomings of conventional ESCs, an object of this invention is to provide an ESC that reduces the occurrence of unwanted wafer clamping to the platen surface.

Another object of the invention is to provide an ESC that allows for relatively high efficiency cooling of the wafer.

Still another object of the invention is to provide an ESC that does not become polarized over time.

Other general and more specific objects of the invention will in part be obvious and will in part appear from the drawings and description which follow.

SUMMARY OF THE INVENTION

The present invention attains the foregoing and other objects by providing an electrostatic chuck according to the teachings of the present invention and methods for producing the same. The electrostatic wafer-holding chuck of the invention includes first and second dielectric plates formed of single crystal aluminum oxide and at least one electrode disposed within a recess formed in the first dielectric plate. The single crystal material preferably does not contain polar molecules that are free to align in the direction of an externally applied electromagnetic field. Specifically, the preferred single crystal material either does not contain polar molecules or contains polar molecules that are restricted in movement, such as those molecules that are bound in or form part of a single crystal lattice structure. Consequently, the material does not become polarized over time, and thus repeatedly and rapidly releases the wafer at the scheduled release time.

The electrostatic chuck of the present invention forms a substantially monolithic, hermetically sealed chuck when the first and second dielectric plates are diffusively jointed together.

According to one aspect of the invention, the second dielectric plate has a top wafer-supporting surface that has a fluid distribution network formed therein. The distribution network channels a heat transfer fluid to the backside of the wafer. According to a preferred practice, the fluid distribution network formed in the second dielectric plate includes a gas distributor and a plurality of radially outwardly extending gas passages that are in fluid communication with the gas distributor. The distribution network can further include a radially outer annular gas passage that surrounds and communicates with the gas distributor and the outwardly extending gas passages.

According to another aspect, when the first and second dielectric plates are assembled, the first dielectric plate is disposed contiguous to the second dielectric plate such that a bottom surface of the second dielectric plate intimately contacts at least a peripheral top portion of a top surface of the first dielectric plate. According to one practice, the first and second plates are diffusively joined together to form a monolithic, hermetically-sealed electrostatic chuck.

According to another aspect, the single crystal dielectric plates each have a C-axis that are aligned so that they are generally parallel relative to each other, and form an angle therebetween of between about 1 degree and about 5 degrees, and preferably less than about 1 degree, when the electrostatic chuck is constructed.

According to another aspect, the first dielectric plate includes a first fluid manifold and an electrical passage that extend between the top and bottom surfaces and the second dielectric plate includes a second fluid manifold. According to one practice, the first and second fluid manifolds align to form a central fluid manifold when the two plates are assembled.

The present invention further includes a method for producing a hermetically sealed electrostatic chuck that includes the steps of (1) providing a first dielectric plate formed of a single crystal material having a recess formed therein, (2) providing a second dielectric plate formed of a single crystal material having a plurality of gas channels formed therein, (3) placing the second dielectric plate contiguous with the first dielectric plate, (4) heating said first and second dielectric plates to an elevated temperature in the range of about 1900° C. and about 2050° C. to diffusively join the first and second dielectric plates together.

According to one aspect, the method further includes the step of disposing an electrode in the recess of the first dielectric plate.

Other general and more specific objects of the invention will in part be obvious and will in part be evident from the drawings and description which follow.

BRIEF DESCRIPTION OF THE DRAWING

The foregoing and other objects, features and advantages of the invention will be apparent from the following description and apparent from the accompanying drawing, in which like reference characters refer to the same parts throughout the different views. The drawing illustrates principles of the invention and, although not to scale, show relative dimensions.

DESCRIPTION OF ILLUSTRATED EMBODIMENTS

Figure 1:
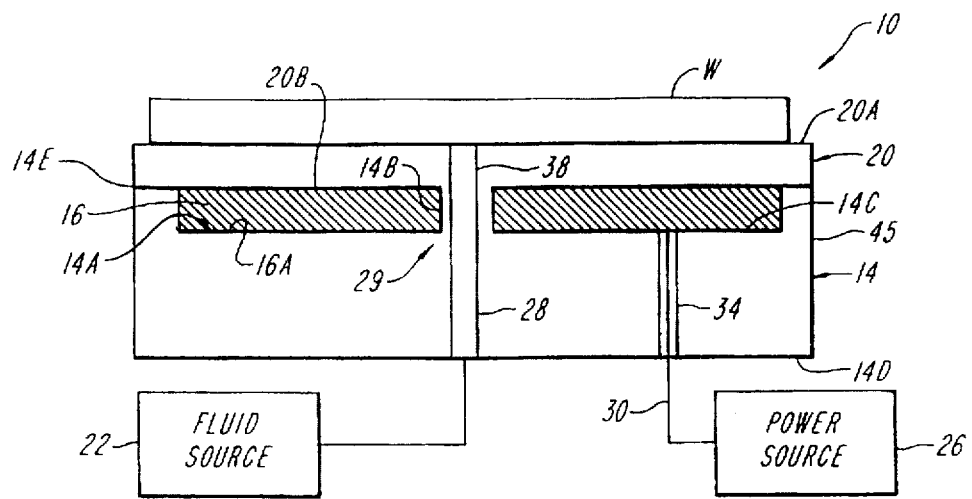
FIG. 1 is a cross-sectional view of the electrostatic chuck of the present invention.
Figure 2:
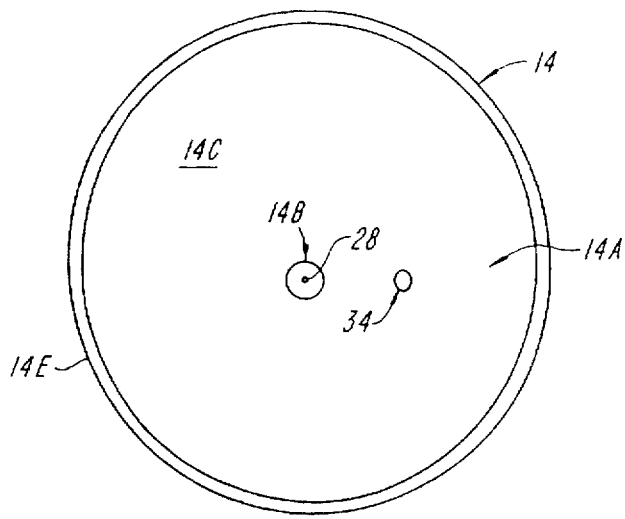
FIG. 2 is a top view of the bottom single crystal dielectric plate of FIG. 1.
Figure 3:
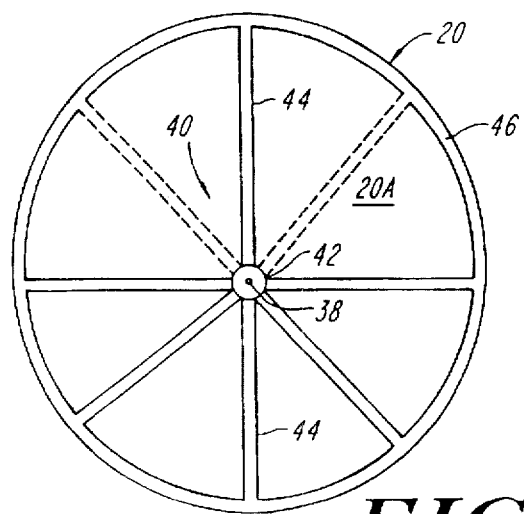
FIG. 3 is a top view of the top single crystal dielectric plate of FIG. 1 showing the gas distribution network of the electrostatic chuck.

FIGS. 1-3 show the electrostatic chuck 10 of the present invention. The illustrated electrostatic chuck includes a bottom dielectric plate 14, a top dielectric plate 20, an electrode 16 which is preferably disposed between the top and bottom plates 14, 20, and a workpiece W. The workpiece preferably seats on top of the top dielectric plate 20 or other portion of the chuck. A gas source 22 is coupled to a central fluid manifold 29 formed by fluid passageways 28, 38 of the top and bottom dielectric plates 14, 20. A power source 26 is coupled to the electrode 16 through an appropriate electrical lead 30. The workpiece W is typically the precursor of an integrated circuit, a flat panel liquid crystal display, or a wafer which has been positioned and disposed for processing by known processing techniques, such as ion implantation or chemical vapor deposition. The illustrated electrostatic chuck 10 is typically employed to either transport the workpiece W into and out of a processing chamber, such as the process chamber of an ion implantation system, or serves to electrostatically clamp the workpiece W during processing. The electrostatic chuck 10 further employs thermal control structure to help cool the workpiece before, during or after processing, as is described in further detail below.

The illustrated electrostatic chuck 10 provides a simple and elegant solution that overcomes problems typically associated with conventional electrostatic chucks. One common problem with conventional chucks is the difficulty of removing the electric charge from the workpiece W and the chuck assembly, e.g., the insulative (dielectric) material, when it is desired to release the workpiece from the chuck, such as upon completion of processing. Another common problem with these ESCs is that the dielectric material becomes polarized over time and tends to act much like a permanent "magnet" (actually an electret), thus clamping the workpiece W to the chuck assembly long after the scheduled released time. These residual forces which remain in the electrostatic chuck even after the cessation of power can arise from permanent polarization of the dielectric, from slow mobile ions located inside the dielectric material, or more commonly from charges trapped at the dielectric circuits or wafer backside, when the wafer has an insulating layer. The uncertainty which is introduced to the manufacturing process by the unwanted continuous clamping of the workpiece to the electrostatic chuck creates problems in implantation systems, and particularly in high throughput ion implantation system. The electrostatic chuck of the present invention addresses these concerns by providing for an electrostatic chuck that does not become polarized over time. According to a preferred practice, the electrostatic chuck of the invention overcomes this problem by utilizing a pair of dielectric plates that are formed of a high purity, single crystal dielectric material so as to form a substrate with polar molecules that are bound in or form part of a substantially unidirectional crystalline lattice, as described in further detail below.

Referring to FIG. 1, the electrostatic chuck 10 includes a bottom dielectric plate 14 that has a recess 14A that seats the electrode 16. The recess 14A preferably includes a central hub portion 14B that extends upwardly from a floor 14C of the recess 14A. The hub portion 14B is configured, in one embodiment, to seat in a central punch hole formed in the interior portion of the electrode 16.

The illustrated bottom dielectric plate 14 further includes a fluid passageway 28 that extends between the bottom surface 14D and the top surface 14E of the plate, and an electrical port 34 that opens at one end onto the floor 14C of the recess 14A. The illustrated electrical port forms a through passage that allows a corresponding electrical lead, e.g., electrical lead 30, to contact the rear surface 16A of the electrode 16.

The top dielectric plate 20 is preferably disposed adjacent to and coextensively with the bottom dielectric plate 14. The dielectric plate 20 includes a central fluid passageway 38 that aligns with the fluid passageway 28, when the two dielectric plates are mounted together, to form a single central fluid manifold 29. A top surface 20A of the dielectric plate 20 has a fluid distribution network 40 formed therein. The illustrated distribution network 40 includes a central fluid hub 42 that is in fluid communication with a plurality of radially outwardly extending channels 44 that terminate in a circumferentially located, annular fluid channel 46.

The illustrated distribution network 40 provides for efficient and uniform cooling or heating of the workpiece W. The central fluid hub 42 functions as a fluid distributor by distributing a heat transfer fluid from the central fluid manifold 29 to each individual radially outwardly extending fluid channel 44. The network 40 thus distributes a heat transfer fluid, such as helium, argon or any suitable liquid, about selected portions of the backside of the workpiece W to provide effective heat transfer between the wafer and the electrostatic chuck 10.

The illustrated fluid distribution network 40 has a selected ratio of channel spacing to channel width that is sufficiently large to distribute the heat transfer medium about the backside of the workpiece W while concomitantly being relatively small so as not to occupy a significant fraction of the surface area of the top surface 20A of the dielectric plate 20. The illustrated fluid channels 44 are selected so as to maximize the heat transfer capabilities between the heat transfer fluid and the workpiece W. These fluid channels can be formed by known machining techniques, including laser machining and abrasive machining, such as ultrasonic abrasive machining.

The particular pattern and arrangement of the fluid channels 44 and the particular number and sizes of the channels can be selected or determined by the ordinarily skilled artisan to maximize the heat transfer between the heat transfer fluid/chuck and the wafer W. The particular arrangement of the components of the fluid distribution network 40, such as the fluid channels 44, can vary depending upon such factors as the size of the dielectric plates, the size of the wafer, the desired maximum wafer temperature, the type of heat transfer medium, and the wafer processing environment. One of ordinary skill in the art would be able to study the aforementioned factors, as well as other factors known to those in the art, to determine the appropriate configuration of the fluid distribution network, without undue experimentation. According to a preferred embodiment, when utilizing top and bottom dielectric plates having a diameter of about 155 mm, the number of radially extending fluid channels 44 can range between about 6 and about 10. Those of ordinary skill will appreciate that other configurations can be employed to effect cooling of the wafer W. The channels preferably have a width between about 1.5 mm and about 4 mm, and most preferably about 2 mm, and have a depth between about 0.04 mm and about 0.10 mm, and most preferably about 0.05 mm deep.

The top dielectric plate 20 preferably has a thickness of about 0.25 mm and the bottom dielectric plate preferably has a thickness ranging between about 2.5 mm and about 6.0 mm. The annular recess 14A formed in the bottom dielectric plate 14 is approximately 0.025 mm deep. The shoulder portion 15 of the bottom dielectric plate 14 preferably has a thickness ranging between about 1 mm and about 2 mm. The top plate is preferably relatively thin to allow a suitable electrostatic force to develop between the wafer W and the top dielectric plate 20. The bottom dielectric plate 14 is preferably relatively thick to provide mechanical support for the workpiece W and seats electrode 16 that is preferably about 0.20 mm thick.

The raised top portion 14E of the bottom dielectric plate 14, which includes the raised peripheral shoulder portion 15 and the central hub 14B, and the rear surface 20B of the top dielectric plate 20 are preferably polished to a flat and smooth surface by conventional polishing techniques.

The present invention overcomes the unwanted and inconsistent clamping problems associated with conventional electrostatic chucks by forming the top and bottom dielectric plates 14, 20 of a single crystal dielectric material. The single crystal dielectric material preferably does not contain polar molecules that are free to align in the direction of an externally applied electromagnetic field. Hence, the preferred single crystal dielectric material either does not contain polar molecules or contains polar molecules that are restricted in movement, such as those molecules that are bound in a single crystal lattice structure. The preferred dielectric material also has a relatively high breakdown field strength, i.e., the material can withstand relatively high voltages without breaking down internally. The material also preferably can be used in high temperature operating environments and thus exhibits good dielectric properties at elevated temperatures. The single crystal dielectric material can include diamond, boron nitride, quartz and magnesium oxide, and preferably is aluminum oxide ($Al_2O_3$).

The single crystal aluminum oxide of the present invention can be formed by conventional manufacturing processes, such as those described in U.S. Pat. No. 3,591,348 of LaBelle, Jr., U.S. Pat. No. 3,687,633 of LaBelle, Jr. et al., U.S. Pat. No. 3,826,625 of Bailey, and U.S. Pat. No. 3,953,174 of LaBelle, Jr., the teachings of which are hereby incorporated by reference.

The top and bottom dielectric plates 14, 20 are preferably made of a single crystal dielectric material each having a selected crystallographic orientation that are nearly parallel to each other. More specifically, the crystallographic orientation of the material comprising each plate 14, 20 are transverse relative to each other and form a relatively small angle therebetween, e.g., are essentially parallel. By way of example, the single crystal dielectric material can comprise an A-plane material which includes a surface normal that lies in the <1120> crystallographic direction. This material further includes a C-axis which lies in the <0001> direction, and which typically lies within and is parallel to the plane of the plate. The C-axes of the top and bottom dielectric plates 14, 20 are preferably transverse relative to each other and form an angle therebetween of less than about 5 degrees, and more preferably less than about 1 degree. This preferred orientation of the C-axes reduces the occurrence of fracturing of the bond between the top and bottom plates when bonded together when the plates are cooled from the elevated bonding temperature to a suitable handling temperature, e.g., room temperature.

The electrostatic chuck 10 of the present invention is assembled as follows. The top and bottom dielectric plates 20, 14 are made from a single crystal dielectric material according to known techniques, and machined to have the appropriate size electrode recess and fluid and electrical conduits. The top dielectric plate 20 is further machined by known methods to include the fluid distribution network 40. The electrode 16 is formed to have a selected size and is placed within the recess 14A. The top dielectric plate 20 is then placed on top of the bottom dielectric plate and the fluid passages 28, 38 are aligned to form the central fluid manifold 29. The electrostatic chuck 10 is then formed into a hermetically sealed structure by heating the axially successive assemblage of the top and bottom dielectric plates 20, 14 and electrode under high vacuum at an elevated temperature between about 1900° C. and about 2000° C., and most preferably between about 1900° C. and 1950° C., while concomitantly applying a pressure to place the polished bottom surface 20B of the top plate 20 in intimate facing contact with the top surface 14E of the bottom plate 14.

The high temperature heating of the electrostatic chuck assemblage promotes interdiffusion of the surfaces of the top and bottom plate to produce a hermetic seal between these components parts that possess the full dielectric strength of the single crystal dielectric material. Because of the high temperature requirements for the diffusive joining of the plates of the electrostatic chuck 10, the electrode 16 is preferably made from an electrically conductive material having a relatively high melting point, or a melting point above the diffusion bonding temperature of the single crystal dielectric material, e.g., above about 1900° C. Suitable metals include the refractory metals. The electrode 16 preferably has a thickness ranging between about 0.10 mm and about 0.20 mm.

The power source 26 is disposed in electrical communication with the sealed electrode 16 by welding an electrical lead to the back surface of the electrode 16, which in turn is connected to an appropriate pole of the power source. A fluid source 22 which contains a supply of a heat transfer fluid 1 is disposed in fluid communication with the fluid manifold 29 formed by the aligned fluid passageways 28, 38 via suitable fluid conduits. The fluid conduits preferably comprise a metal tube that is brazed onto the bottom surface 14D of the bottom dielectric plate 14. The tube preferably is composed of a metal alloy having a thermal expansion coefficient that is closely matched to that of the single crystal dielectric material, e.g., aluminum oxide. This metal tube can then be brazed to a tube formed of a higher expansion material, such as stainless steel, to afford a hermetic and mechanically reliable fluid connection between the fluid source 22 and the illustrated electrostatic chuck 10.

In operation, a workpiece W is place on the top surface 20A of the top dielectric plate 20. An electrostatic charge is generated by the application of a voltage, supplied by power source 26, to the electrode 16 along electrical lead 30. The applied voltage produces an equal and opposite charge on the rear surface of the wafer, thus electrostatically clamping the wafer to the top surface 20A of the dielectric plate 20. The particular amount of charge, which determines the magnitude of the clamping force, is dependent upon the thickness of the dielectric material, the dielectric material's dielectric constant, the spacing of the vacuum gap between the wafer and the dielectric, and the clamp voltage. The wafer is then processed according to known processing techniques. By way of example, during these processing techniques, the wafer W can be heated to a selected elevated temperature. Ideally, semiconductor wafers are maintained at temperatures below 100° C. to prevent damage to the photoresist typically formed on the semiconductor wafer W. To control the temperature of the semiconductor wafer, a selected heat transfer fluid, such as helium, is supplied by the fluid source 22 and coupled to the aligned fluid passageways 28, 38 by the foregoing fluid conduits. The applied fluid is distributed by the hub gas distributor 42 to the radially outwardly extending fluid passages 44. The heat transfer fluid convectively transfers heat from the wafer W to the electrostatic chuck and the cooling fluid. The fluid is then transported to the circumferential passage 46 and is removed therefrom by appropriate exhaust structure. The heat transfer that occurs between the wafer and fluid, and between the wafer and electrostatic chuck surface helps maintain the temperature of the semiconductor wafer W below critical temperatures.

Once processing is complete the power source 26 is turned off to cessate the application of power to the electrode 16. This substantially instantaneously releases the semiconductor wafer W from the electrostatic chuck 20. Hence, the electrostatic chuck 10 of the invention easily releases the wafer W at the scheduled release time. Alternatively, the semiconductor wafer W can be disengaged from the electrostatic chuck 10 by the application of a de-chucking voltage which has a magnitude similar to the voltage applied during processing, but of opposite polarity.

The electrostatic chuck 10 illustrated in FIG. 1 can be of a monopolar or bipolar design. In the illustrated monopolar design, the electrostatic chuck 10 is typically employed only during the ion implantation process, since the applied ion plasma stream serves to discharge the energy applied by the power source 26 to the electrode, and which accumulates at the wafer surface. Conversely, the illustrated electrode 16 can be formed from two separate and electrically isolated electrodes, formed as semicircular electrodes, to form a bipolar design. In this design, the first electrode is coupled to the positive pole of the power source 26 and the other electrode is connected to the negative pole of the power source. This electrical configuration maintains the electrode at a ground potential. Hence, the bipolar design can be used before or after the implantation process.

The power source 26 can be either an AC or a DC power source depending upon the particular processing environment. Thus, for example, in the case of low throughput etch and plasma deposition systems, a DC clamping voltage is typically used to electrostatically clamp the semiconductor wafer W to the electrostatic chuck 10. In high throughput ion implantation systems, a bipolar polyphase AC power source is used to generate the electrostatic charge which electrostatically clamps the semiconductor wafer W.

A significant advantage of the present invention is that the electrostatic chuck of the invention which is composed of a single crystal dielectric material releases the semiconductor wafer substantially at the scheduled release time. The single crystal dielectric material, such as aluminum oxide, provides for this rapid-release action since the free molecules (if present) of the dielectric material cannot align with the applied electric field.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall there between.

Having described the invention, what is claimed as new and desired to be secured by Letters Patent is:

1. An electrostatic wafer-holding chuck, comprising:

a first dielectric plate formed of single crystal aluminum oxide having a first surface and an opposed second surface, said first surface having formed therein a recess, at least one electrode disposed within the recess formed in the first surface of the first dielectric plate, and a second dielectric plate formed of single crystal aluminum oxide having a first wafer-supporting surface and an opposed second surface, said first wafer-supporting surface having a fluid distribution network formed therein, said first dielectric plate disposed contiguous to said second dielectric plate such that said second surface of said second dielectric plate intimately contacts at least a peripheral portion of said first surface of said first dielectric plate, wherein said single crystal aluminum oxide materials forming said first and second dielectric plates each have a C-axis, said C-axes being aligned so that they are generally parallel relative to each other and form an angle therebetween of less than about 5 degrees when said electrostatic chuck is constructed.

2. The electrostatic chuck of claim 1 wherein said angle formed between said C-axes of the said single crystal aluminum oxide materials forming first and second dielectric plates is between about 1 degree and about 5 degrees.

3. The electrostatic chuck of claim 1 wherein said first and second dielectric plates are diffusely joined together to form a monolithic, hermetically-sealed chuck.

4. The electrostatic chuck of claim 1 wherein said fluid distribution network formed in said first surface of said second dielectric plate includes a fluid distributor and a plurality of outwardly extending fluid passages that are in fluid communication with said fluid distributor.

5. The electrostatic chuck of claim 4 wherein said fluid distribution network further comprises an outer fluid channel that surrounds said fluid distributor and said outwardly extending fluid passages, said outer fluid channel being in fluid communication with said outwardly extending fluid passages.

6. The electrostatic chuck of claim 1 wherein said first dielectric plate further comprises a first fluid manifold that extends between said first and second surfaces of said first dielectric plate, and a first electrical passage that extends between said first and second surfaces of said first dielectric plate and opens onto said recess.

7. The electrostatic chuck of claim 6 wherein said second dielectric plate comprises a second fluid manifold that extends between said first and second surfaces of said second dielectric plate, said first and second fluid manifolds being aligned when said dielectric plates are disposed contiguous relative to each other to form a fluid lumen for supplying a heat transfer fluid to said fluid distribution network.

8. An electrostatic chuck system, comprising:

a first dielectric plate formed of single crystal aluminum oxide having a first surface and an opposed second surface, said first surface having formed therein a recess, an electrode disposed within the recess formed in said first surface of said first dielectric plate, a second dielectric plate formed of single crystal aluminum oxide having a first wafer-supporting surface and an opposed second surface,said first surface, having a fluid distribution network formed therein, said second plate being disposed contiguous to said first plate such that the second surface of said second plate intimately contacts a peripheral portion of said first surface of said first dielectric plate, and wherein said single crystal aluminum oxide materials forming said first and second plates each have a C-axis, said C-axes being generally parallel relative to each other and form an angle therebetween of less than about 5 degrees when said electrostatic chuck is constructed, fluid introduction means coupled to said first and second dielectric plates for introducing a heat transfer fluid to said fluid distribution network, and voltage means coupled to said electrode for supplying a voltage thereto.

9. The electrostatic chuck system of claim 8 wherein said first and second dielectric plates are diffusively joined together to form a monolithic, hermetically-sealed chuck.

10. A method of producing an electrostatic chuck, comprising the steps of providing a first dielectric plate formed of a single crystal material having a first surface and an opposed second surface, said first surface having an electrode recess formed therein, and providing a second dielectric plate formed of a single crystal material having a first wafer-supporting surface and an opposed second surface, said first surface having a fluid distribution network formed therein, wherein said single crystal material of said first and second dielectric plates each have a C-axis, said C-axes being generally parallel relative to each other to form an angle therebetween of less than about 5 degrees when the chuck is constructed, placing said second dielectric plate contiguous with said first dielectric plate such that said second surface of said second dielectric plate intimately contacts a peripheral portion of said first surface of said first dielectric plate, and heating said first and second dielectric plates to an elevated temperature in the range between about 1900° C. and about 2000° C. to diffusively join said second surface of said second dielectric plate to said first surface of said first dielectric plate.

11. The method of claim 10 further comprising, prior to the step of placing, the step of disposing an electrode in said recess of said first surface of said first dielectric plate.

12. The method of claim 10 wherein said single crystal material comprises single crystal aluminum oxide.

13. The method of claim 10 further comprising the steps of forming a first fluid manifold that extends between said first and second surfaces of said first dielectric plate, forming an electrical passage that extends between said first and second surfaces of said first dielectric plate and that opens onto said recess, and forming a second fluid manifold that extends between said first and second surfaces of said second dielectric plate, said first and second fluid manifolds, when aligned, forming a fluid lumen for supplying a heat transfer fluid to said fluid distribution network.

14. An electrostatic wafer-holding chuck, comprising:

a first dielectric plate formed of single crystal aluminum oxide having a first surface and an opposed second surface, said first surface having formed therein a recess, at least one electrode disposed within the recess formed in the first surface of the first dielectric plate, and a second dielectric plate formed of single crystal aluminum oxide having a first wafer-supporting surface and an opposed second surface, wherein said single crystal aluminum oxide materials forming said first and second dielectric plates each have a C-axis, said C-axes being aligned so that they are generally parallel relative to each other and form an angle therebetween of less than about 5 degrees when the electrostatic chuck is constructed.

15. The electrostatic chuck of claim 14, wherein said wafer-supporting surface of said second dielectric plate has a fluid distribution network formed therein.

16. The electrostatic chuck of claim 15, further comprising fluid introduction means coupled to said first and second dielectric plates for introducing a heat transfer fluid to said fluid distribution network, and voltage means coupled to said electrode for supplying a voltage thereto.

17. A method of producing an electrostatic chuck, comprising the steps of providing a first dielectric plate formed of a single crystal material having a first surface and an opposed second surface, said first surface having an electrode recess formed therein, and providing a second dielectric plate formed of a single crystal material having a first wafer-supporting surface and an opposed second surface, wherein said single crystal material of said first and second dielectric plates each have a C-axis, said C-axes being generally parallel relative to each other to form an angle therebetween of less than about 5 degrees when the chuck is constructed, placing said second dielectric plate contiguous with said first dielectric plate such that said second surface of said second dielectric plate contacts a peripheral portion of said first surface of said first dielectric plate, and heating said first and second dielectric plates to an elevated temperature to join said second surface of said second dielectric plate to said first surface of said first dielectric plate.

* * * * *